United States Patent [19]

Landsman

[11] Patent Number: 4,600,895
[45] Date of Patent: Jul. 15, 1986

[54] PRECISION PHASE SYNCHRONIZATION OF FREE-RUNNING OSCILLATOR OUTPUT SIGNAL TO REFERENCE SIGNAL

[75] Inventor: Stephen P. Landsman, Randallstown, Md.

[73] Assignee: Minnesota Mining and Manufacturing Company, St. Paul, Minn.

[21] Appl. No.: 727,422

[22] Filed: Apr. 26, 1985

[51] Int. Cl.⁴ .......................... H03L 7/00; H04N 5/04
[52] U.S. Cl. .................................... 331/1 A; 331/20; 358/158
[58] Field of Search ........................... 331/1 A, 20, 25; 358/158; 328/155; 307/516; 375/111

[56] References Cited

U.S. PATENT DOCUMENTS 4,475,088 10/1984 Beard .................................. 328/155

FOREIGN PATENT DOCUMENTS 3103574 8/1982 Fed. Rep. of Germany ...... 375/111

OTHER PUBLICATIONS

McGovern, T. L. et al., "Triad Incremental Phase Shifter" *APL Technical Digest*, vol. 12, No. 4, Oct.-Dec. 1973, pp. 2-11.

"Digital Video Synchronizer XTAL Oscillator Phase Selector RCS-401" Preliminary Specification; Third Domain, Inc., 1/21/85.

*Primary Examiner*—Eugene R. LaRoche
*Assistant Examiner*—D. C. Mis
*Attorney, Agent, or Firm*—Donald M. Sell; James A. Smith; William B. Barte

[57] ABSTRACT

A synchronization circuit for a free-running oscillator, in which a multi-tapped delay line provides delayed outputs incrementally spaced throughout the period and at the same frequency as the oscillator. That delayed signal closest in time to a reference signal is selected as the output signal, synchronized to the reference signal.

5 Claims, 2 Drawing Figures

PRECISION PHASE SYNCHRONIZATION OF FREE-RUNNING OSCILLATOR OUTPUT SIGNAL TO REFERENCE SIGNAL

FIELD OF THE INVENTION

This invention relates to circuits for controlling the synchronization of related signals, such as phase lock loops and the like.

BACKGROUND OF THE INVENTION

Phase lock loop synchronization circuits are often used to synchronize related signals. For example, such related signals frequently exist in video graphic display circuits wherein horizontal sync pulses must be in phase with a higher frequency such as a "dot-frequency" on which the generation of individual dots making up a video graphic display are based. Such phase lock loop circuits require that the two frequencies be harmonically related, which is not always possible. In lieu of such phase lock loop circuits, it is also known to gate a crystal oscillator by reference signal pulses, however, the precision of such gating has associated with it timing errors of up to ± one period of the crystal oscillator frequency. Also, while RC-type oscillators may be reliably keyed by reference signals, such oscillators typically exhibit frequency instability and inaccuracies, particularly immediately after first being activated. As one primary use for a synchronization circuit would be to precisely key an extremely stable oscillator, thus, providing a very precise phase and frequency source for use in raster scanned video graphic displays, without the need for phase lock loop clocking or a harmonic relationship existing between the oscillator frequency and that of the reference signal, such previously known circuits have proven unsatisfactory.

SUMMARY OF THE INVENTION

The synchronization circuit of the present invention utilizes a continuous free-running crystal controlled oscillator, the frequency of which is predetermined, and is equal to the final output frequency. In the present circuit, the output of the oscillator provides an input signal oscillating at a predetermined frequency which is fed to delay means for generating a plurality of output signals at the predetermined frequency, each output signal being shifted in phase with respect to the input signal a different fraction of the period of that signal. Means are further provided for selecting that output signal from the delay means which has a transition at a time closest to the time of the selected transition of the reference signal, and for outputting that selected output signal as the synchronized output signal.

Preferably, the delay means comprises a multi-tapped delay line, each delay element within the delay line representing the desired or maximum phase jitter to be tolerated at the output. Each of the taps of the delay line are coupled in parallel to a high speed latch, or store-and-hold circuit and to a multiplexer. The latch is keyed by the selected transition of the reference signal, and when thus keyed selects the value of each output signal at that instant. The values of adjacent incrementally shifted and delayed output signals are compared, and by means of priority logic, the delayed signal having a transition closest to the selected transition of the reference signal is selected by the multiplexer and is outputted as the synchronized output. Upon the occurrence of the next reference signal transition the entire process is repeated, so as to continuously update the synchronization of the oscillator to the reference signals. The above selection process will yield an output frequency with a phase accuracy within one delay line element.

In a preferred embodiment, a free-running crystal-controlled oscillator running at 28.63 megahertz, may be desirably utilized as the dot frequency within a video graphic display device. As such a frequency has a period associated therewith of approximately 35 nanoseconds, if the oscillator were synchronized only within the accuracy of that period, a lateral shift in each horizontal line in the graphic display formed in response to the dot frequency of up to ±35 nanoseconds could result, thereby shifting adjacent columns of a given character by as much as the spacing between adjacent columns of dots. By providing, for example, 7 taps within the delay line, such a ±35 nanosecond potential error is reduced to the spatial spacing between the adjacent taps, i.e., ±5 nanoseconds. The accuracy of the synchronization of the present invention may thus be recognized to be limited only by the number of taps provided within the delay means.

DETAILED DESCRIPTION OF THE PREFERRED EMBODIMENT

Figure 1:
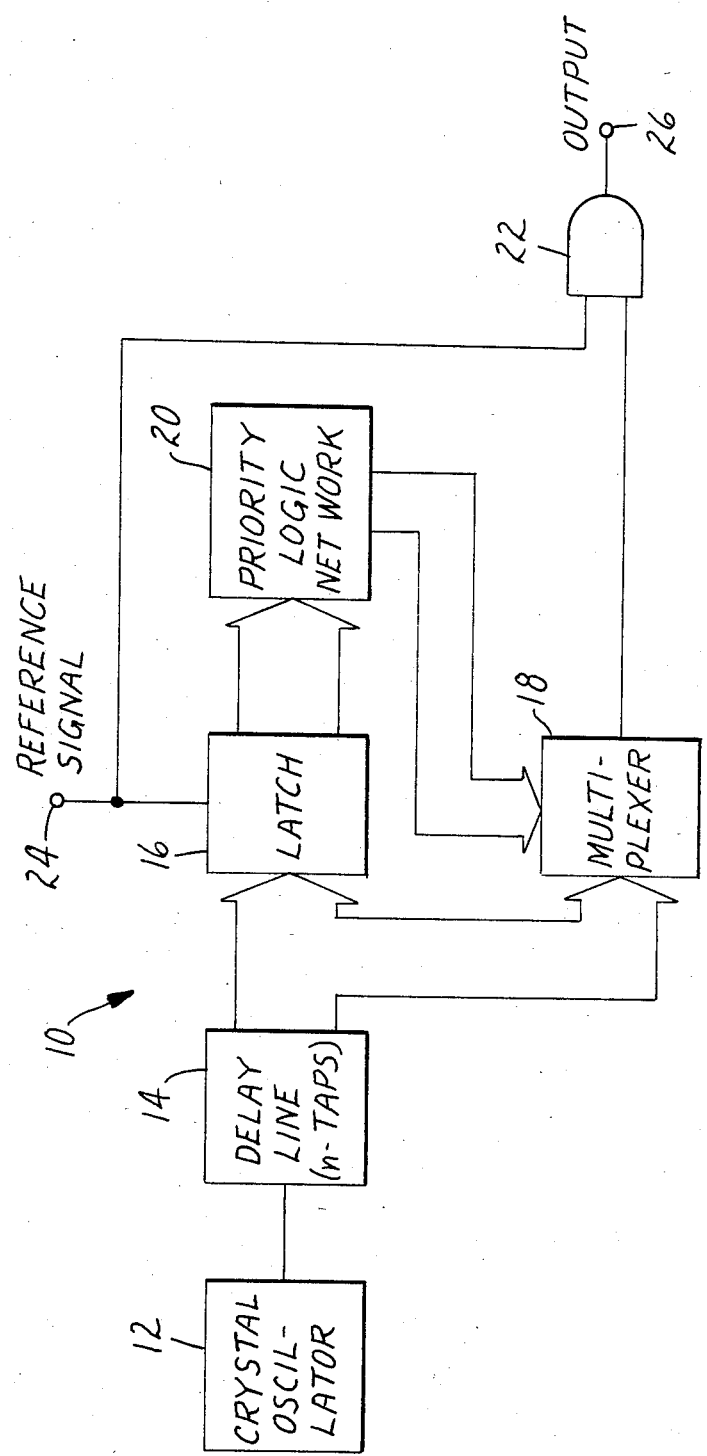
FIG. 1 is a simplified block diagram of the circuit of the present invention.

As set forth in the simplified block diagram set forth in FIG. 1, the synchronization circuit 10 of the present invention may be seen to be responsive to the output of a free-running crystal oscillator 12. Such an oscillator is typically provided within video graphic display devices in order to provide a dot frequency such as at 28.63 megahertz and upon which graphic characters are constructed. The output of the oscillator is coupled to a multi-tap delay line 14 which has as many outputs as are desired to provided delayed outputs each being incrementally shifted from the immediately preceding output so as to provide a plurality of delayed output signals preferably extending uniformly throughout the entire period corresponding to the frequency of the output of the crystal oscillator 12. Thus, for example, where the output of the crystal oscillator has a frequency of 28.63 megahertz and therefore has as a period of approximately 35 nanoseconds, a delay line having seven taps thereby providing delayed outputs each of which are incrementally spaced 5 nanoseconds from the adjacent preceding output may be provided. The outputs from the delay line are coupled in parallel to a high speed latch 16 as well as to a multiplexer circuit 18. Parallel outputs from the latch 16 are in turn coupled to a priority logic network 20 which provides a control signal which controls the output of the multiplexer 18, that output in turn being coupled to an AND gate 22.

In operation, the latch 16 is keyed by a reference signal at terminal 24. Such a reference signal may, for example, be a selected transition of a standard occurring signal such as the trailing edge of the horizontal sync pulse readily available in video equipment. Upon the occurrence of such a selected transition, the latch 16 stores the instantaneous value of each of the delayed output signals from the delay line 14. As the respective outputs are incrementally spaced throughout the entire period of one oscillation of the oscillator frequency, it will be recognized that the stored values will be either binary zeros or ones depending upon whether the stored values are high at the instant of the occurrence of the reference signal transition or are low at that instance. The stored values are then coupled to the priority logic network 20 which selects that value associated with a given delayed output signal which has the transition closest to the selected transition of the referece signal. This information is conveyed in a control signal coupled to the multiplexer 18. Operating on such a control signal, the multiplexer causes that selected delayed output signal to be coupled to the AND gate 22 and upon simultaneous occurrence of the selected transition of the reference signal supplied from terminal 24, a synchronized output signal is provided at terminal 26.

Figure 2:
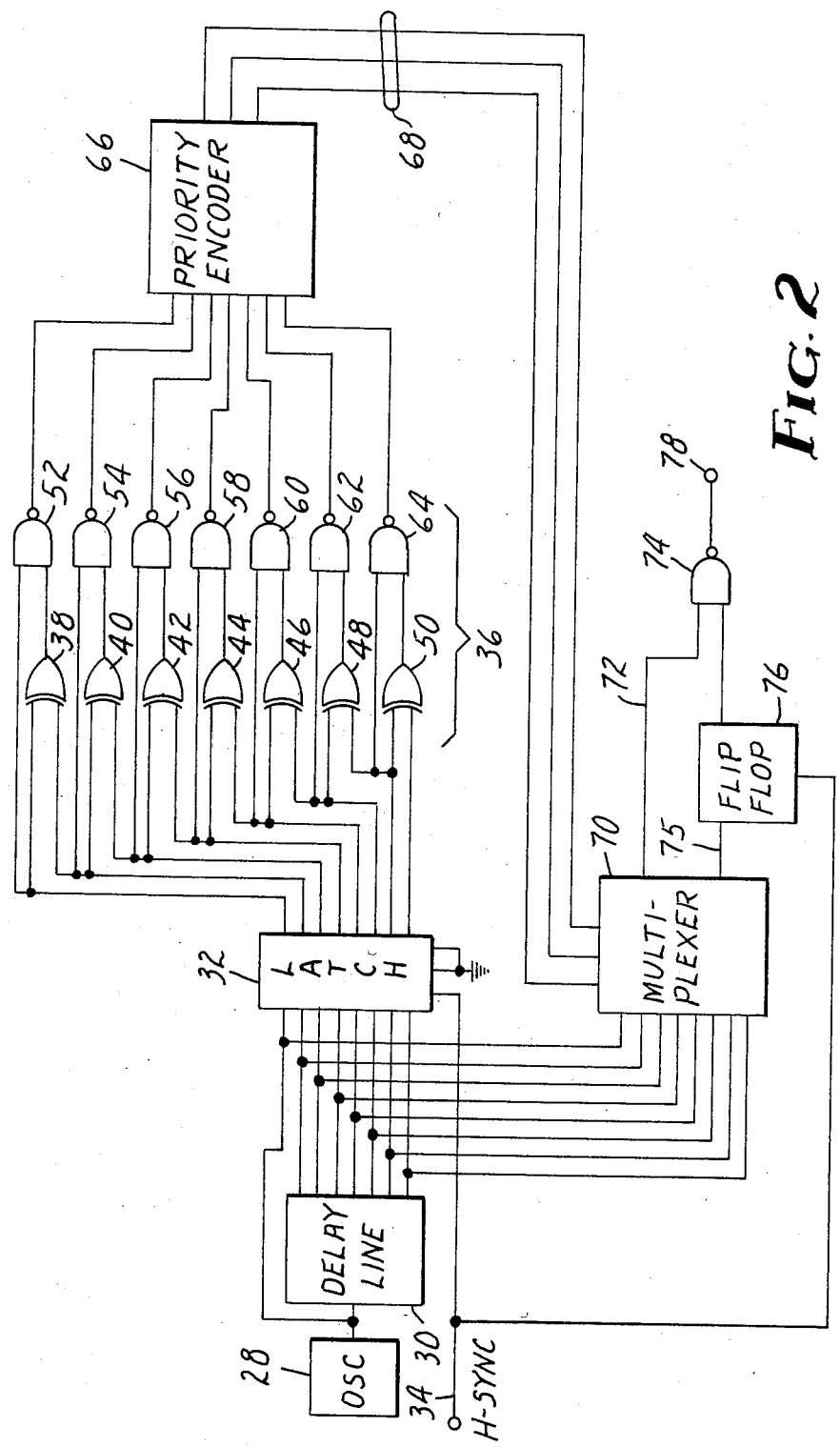
FIG. 2 is a detailed schematic of the circuit of the present invention.

As set forth in more detail in the schematic shown in FIG. 2, it may there be seen that the output from an oscillator 28 is coupled to a multi-tap delay line 30. Such a delay line may, for example, be a type XTTLDM-50 logic delay module manufactured by Engineered Components Co., San Luis Obispo, Calif. The respective outputs from the delay line 30 provide as described above, a plurality of incrementally shifted delayed output signals having the same frequency as that of the input signal provided by the oscillator 28 but wherein each signal is shifted by an amount $aP/b$, where b is the number of taps on the delay line, i.e., the number of the plurality of output signals, a is an integer between 0 and b, and P is the periodicity of the input signal from the oscillator 28. These delayed outputs together with a non-delayed output directly from the oscillator 28 are then coupled to a high speed latch 32 such as an octal D-type flip-flop, type 74F374 manufactured by Texas Instruments and like companies. The latch 32 is clocked by a reference signal appearing on lead 34 which may, for example, be a horizontal synchronizing pulse. Particularly, the latch is connected so as to respond to the trailing, i.e., positive going transition of a normal negative going sync pulse and upon the occurrence of that selected transition, the latch stores and holds the value of each of the plurality of outputs at that instant.

The stored values are in turn coupled to a comparing means 36 made up of a plurality of exclusive OR gates and NAND gates. It will be noted that each of the exclusive OR gates 38 through 50 is coupled to adjacent outputs from the latch on which appear the stored value associated with adjacent incrementally delayed output signals from the delay line 30. Accordingly, if at the instant of the selected transition of the reference signal appearing on lead 34, the stored values appearing at each of the gates are alike, the output of the respective exclusive OR gates will remain at a low level. In contrast, if the adjacent stored values are dissimilar indicating that one of the delayed output signals has switched to a different level than that of the adjacent output signal, the output of that exclusive OR gate will switch to a high level such as a binary 1.

The outputs from the array of exclusive OR's 38 through 50 are in turn coupled to a like array of NAND gates 52 through 64, the other input to each of the gates being coupled directly to one of the outputs from the latch 32. The NAND gates, thus respond to respective values outputted from the latch together with the respective outputs from the exclusive OR gates and provide parallel associated signals only one of which will be low at the time of the selected transition of the reference signal and will thus identify which of the delayed output signals occurs in time closest to that selected transition. The associated signals are in turn coupled to a priority encoder such as a type 74148 integrated circuit manufactured by Texas Instruments. Such an encoder is preferably an 8 line to 3 line octal priority encoding circuit and produces at its output on leads 68 a binary code definitive of that associated signal which was low at the time of the selected transition of the reference signal. The control signal on leads 68 is in turn coupled to a multiplexer 70 such as a data selector/multiplexer integrated circuit type 74F251 manufactured by Texas Instruments. In response to the binary code appearing on leads 68, the multiplexer selects the one of the 8 input delayed output signals from the delay line 30 having the desired phase. The selected delayed output signal is then coupled on lead 72 to an output gate 74. An inverted output from the multiplexer 70 on lead 75 is coupled to a flip-flop 76. In response to an enabling signal on lead 34, the flip-flop 76 couples the inverted output to the gate 74 to thereby enable the final output. During the sync interval, the flip-flop will reset and prevent spurious outputs from the multiplexer from passing through the gate 74, and when initialized, will allow only complete clock intervals to pass.

While the circuit as described in conjunction with FIGS. 1 and 2 may be preferably employed in a given application due to the ready availability of horizontal sync signals as reference signals and preexisting oscillator circuits and the like, it is similarly within the scope of the present invention that the circuit be utilized in a variety of other applications and similarly constructed of a variety of other means for determining that delayed output signal which occurs in closest synchronization with a selected transition of a reference signal. Thus, for example depending upon the frequency requirements of the synchronization, the high speed latch 32 may be substituted for other store and hold circuits well known to those skilled in the art. Similarly, the array 36 of exclusive OR and NAND gates and the priority encoder 66 may be substituted with analogous comparison circuits for sensing the value of a given delayed signal so as to provide an appropriate control signal.

The present technique is particularly useful in a video display character generator such as type D-5000 manufactured by Minnesota Mining and Manufacturing Company. In such an application, the circuit enables the elimination of phase lock loops and associated circuits used with voltage controlled oscillators, thus avoiding thermal instability and frequency drift with age. Also the present circuit locks instantly to a synchronization signal and since no bandwidth restrictions are thus present, it can be used over a virtually infinite capture range. In such a preferred application, using 8 tapped delays, synchronization of a 35 nanosecond period signal is readily achieved to within ±5 nanoseconds. The accuracy of the synchronization is thus limited only by the choice of the number of delayed outputs.

The present circuit may also be advantageously used in time base correction circuits and the like common in video recorders, etc., wherein synchronization of recorded signals to standard time bases is required.

Also, in order to minimize the number of taps necessary to obtain a high resolution accuracy at lower frequencies, the circuit as disclosed herein may be modified to include frequency dividers at the output. Thus, for example, if a ±5 nanosecond synchronization accuracy is desired in a 14.32 megahertz signal, rather than providing a 16 tap delay line, synchronization to a 28.64 megahertz signal via a 8 tap delay line may be achieved as before, and that signal converted to a synchronized 14.32 megahertz signal via a conventional frequency divider circuit.

I claim:

1. A circuit for providing a synchronized output signal at a predetermined frequency which is synchronized with a selected transition of an input reference signal, comprising
   (a) delay means coupled to receive an input signal oscillating at said predetermined frequency for generating a plurality of output signals at said predetermined frequency, each output signal being shifted in phase with respect to the input signal on a different fraction of the period of the input signal,
   (b) means for selecting that output signal from the delay means having a transition at a time closest to the time of said selected transition of said reference signal, and
   (c) means for outputting said selected output signal as said synchronized output signal.

2. A circuit according to claim 1, wherein said delay means comprises means for producing a plurality of delayed output signals each incrementally displaced an interval of time equal to aP/b, where b is the number of plurality of output signals, a is an integer between 0 and b and P is the periodicity of the input signal.

3. A circuit according to claim 2, wherein said delay means includes means for producing said plurality of output signals each of which alternates between a first and second value, and wherein said selecting means comprises
   (i) store and hold means for selecting the value of each output signal at a time corresponding to said selected transition,
   (ii) means for comparing each value of adjacent incrementally delayed output signals and for providing a plurality of associated signals each indicative of whether the compared values are the same or are dissimilar,
   (iii) means responsive to said associated signals for outputting a control signal indicative of the first associated signal corresponding to adjacent delayed output signals having dissimilar values at the time of said selected transition, and
   (iv) means responsive to said control signal for outputting the first delayed output signal which resulted in said first associated signal as said synchronized output signal.

4. A circuit according to claim 3, wherein said comparing means produces binary associated signals having a first state if the stored values of adjacent delayed output signals are the same at the time of said selected transition and having a second state if the stored values of adjacent delayed output signals are dissimilar at the time of said selected transition, and wherein said control signal outputting means includes means for comparing the states of the adjacent associated signals and for providing a binary coded control signal indicative of said first associated signal.

5. A circuit according to claim 1, wherein
   (a) said delay means is coupled to receive an input signal and includes means for generating a plurality of output signals at the same frequency as the input signal, each of which is shifted in phase a fraction of the period thereof,
   (b) said selecting means includes means responsive to the phase shift between the input signal and each output signal at the time of said selected transition, and
   (c) means for selectively operating on the output signals to cause the selected output signal to have a transition in phase with the selected transition of the reference signal.

* * * * *